United States Patent
Kornitz et al.

(10) Patent No.: US 8,070,324 B2
(45) Date of Patent: Dec. 6, 2011

(54) THERMAL CONTROL SYSTEM FOR A LIGHT-EMITTING DIODE FIXTURE

(75) Inventors: Alexander Kornitz, Richmond (CA); Mirek Pospisil, West Vancovuer (CA)

(73) Assignee: MP Design Inc., Vancouver (CA)

( * ) Notice: Subject to any disclaimer, the term of this patent is extended or adjusted under 35 U.S.C. 154(b) by 119 days.

(21) Appl. No.: 12/182,972

(22) Filed: Jul. 30, 2008

(65) Prior Publication Data

US 2010/0027276 A1 Feb. 4, 2010

(51) Int. Cl.
 *F21V 29/00* (2006.01)
(52) U.S. Cl. .............. 362/294; 362/295; 361/679.47; 361/679.54
(58) Field of Classification Search .............. 362/373, 362/295, 294; 361/679.47, 679.54
See application file for complete search history.

(56) References Cited

U.S. PATENT DOCUMENTS

| | | | |
|---|---|---|---|
| 4,003,729 A * | 1/1977 | McGrath | 62/93 |
| 5,731,952 A | 3/1998 | Ohgami et al. | |
| 5,757,172 A | 5/1998 | Hunsdorf et al. | |
| 5,940,267 A | 8/1999 | Katsui et al. | |
| 6,621,239 B1 * | 9/2003 | Belliveau | 315/312 |
| 7,015,470 B2 | 3/2006 | Faytlin et al. | |
| 7,609,018 B2 * | 10/2009 | Lin et al. | 318/471 |
| 2003/0091441 A1 * | 5/2003 | Huang et al. | 417/42 |
| 2005/0152146 A1 * | 7/2005 | Owen et al. | 362/294 |
| 2005/0225990 A1 * | 10/2005 | Kirk | 362/362 |
| 2005/0279949 A1 * | 12/2005 | Oldham et al. | 250/458.1 |
| 2006/0018123 A1 | 1/2006 | Rose | |
| 2006/0028796 A1 * | 2/2006 | Li et al. | 361/690 |
| 2006/0083031 A1 | 4/2006 | Cook, II | |
| 2006/0126346 A1 | 6/2006 | Mighetto | |
| 2007/0024411 A1 * | 2/2007 | Lang et al. | 338/22 R |
| 2007/0115686 A1 | 5/2007 | Tyberghien | |
| 2007/0273290 A1 * | 11/2007 | Ashdown et al. | 315/113 |
| 2008/0143275 A1 * | 6/2008 | Hoffman | 315/309 |
| 2008/0304303 A1 * | 12/2008 | Hsieh et al. | 363/141 |

FOREIGN PATENT DOCUMENTS

| | | | |
|---|---|---|---|
| GB | 1489183 | | 10/1977 |
| JP | 04133762 A2 | | 5/1992 |
| KR | 2005113737 | * | 12/2005 |

OTHER PUBLICATIONS

Different Methods to Control Fan Speed, http://www.comairrotron.com/fan_speed_control.shtml.
Abstract of Japanese Publication No. 4133762 with data supplied by the espacenet database.

* cited by examiner

*Primary Examiner* — Evan Dzierzynski
(74) *Attorney, Agent, or Firm* — Cameron IP

(57) ABSTRACT

A thermal control system for a light-emitting diode comprises a thermistor array thermally coupled to a heat sink. The thermistor array may be disposed within a thermal conductive member. A power supply is electrically connected to the thermistor array. A cooling device is electrically connected in series with the power supply and the thermistor array. The thermistor array is between the power supply and the cooling device. A rheostat may further be electrically connected, in series, between the thermistor array and the cooling device.

13 Claims, 4 Drawing Sheets

US 8,070,324 B2

THERMAL CONTROL SYSTEM FOR A LIGHT-EMITTING DIODE FIXTURE

BACKGROUND OF THE INVENTION

1. Field of the Invention

The present invention relates to light-emitting diodes and, in particular, to a thermal control system for a light-emitting diode fixture.

2. Description of the Related Art

Light-emitting diodes, like any semiconductor, emit heat during their operation. This is because not all of the electrical energy provided to a light-emitting diode is converted to luminous energy. A significant portion of the electrical energy is converted to thermal energy which results in an increase in the temperature of the light-emitting diode. In resistor driven circuits, as the temperature of the light-emitting diode increases, the forward voltage drops and the current passing through the PN junction of the light-emitting diode increases. The increased current causes additional heating of the PN junction and may thermally stress the light-emitting diode.

Thermally stressed light-emitting diodes lose efficiency and their output is diminished. In certain situations, optical wavelengths may even shift causing white light to appear with a blue tinge. Thermally stressed light-emitting diodes may also impose an increased load on related driver components causing their temperature to increase as well. This may result in broken wire bonds, delaminating, internal solder joint detachment, damage to die-bond epoxy, and lens yellowing. If nothing is done to control the increasing temperature of the light emitting diode, the PN junction may fail, possibly resulting in thermal runaway and catastrophic failure.

Thermal control of light-emitting diodes involves the transfer of thermal energy from the light-emitting diode. Accordingly, one aspect of light-emitting diode fixture design involves efficiently transferring as much thermal energy as possible away from the PN junction of the light-emitting diode. This can generally be accomplished, at least in part, through the use of a heat sink. However, for more powerful light-emitting diode fixtures in the 20 to 60 watt range or in applications where numerous light-emitting diodes are disposed within a confined space, an additional cooling means may be required to maintain performance. This is because the thermal energy generated by the light-emitting diodes may at times exceed the thermal energy absorbed and dissipated by the heat sink. In these situations a cooling fan is typically used in combination with the heat sink.

In a conventional thermal control system for light-emitting diode fixtures, a heat sink and a cooling fan are thermally coupled to a light source comprised of a plurality of light-emitting diodes. A thermal sensor senses the temperature of the light source and signals a controller to operate a variable speed cooling fan, based on the temperature of the light source, to maintain the fixture within a desired temperature range. However, the need for a controller, typically in the form of microprocessor, increases the number of components in the thermal control system and thereby increases manufacturing costs.

BRIEF SUMMARY OF THE INVENTION

It is an object of the present invention to provide an improved thermal control system for a light-emitting diode fixture.

In particular, it is an object of the present invention to provide a thermal control system for a light-emitting diode fixture which has a reduced number of component parts.

Accordingly, there is provided a thermal control system for a light-emitting diode comprising a thermistor thermally coupled to a heat sink. Preferably the thermistor is disposed within a thermally conductive member. A power supply is electrically connected to the thermistor. A cooling device is electrically connected in series with the power supply and the thermistor. The thermistor is between the power supply and the cooling device. A rheostat may further be electrically connected, in series, between the thermistor and the power supply.

There is also provided a light-emitting diode fixture having a thermal control system. The fixture comprises a heat sink thermally coupled to a light-emitting diode. A thermistor is thermally coupled to the heat sink. Preferably the thermistor is disposed within a thermally conductive member. A power supply is electrically connected in parallel to the light-emitting diode and the thermistor. A cooling device is electrically connected in series with the power supply and the thermistor. The thermistor is between the power supply and the cooling device. A rheostat may further be electrically connected, in series, between the thermistor and the power supply.

BRIEF DESCRIPTION OF THE DRAWINGS

The present invention will be more readily understood from the following description of preferred embodiment thereof given, by way of example, with reference to the accompanying drawings, in which.

DESCRIPTION OF THE PREFERRED EMBODIMENTS

Figure 1:
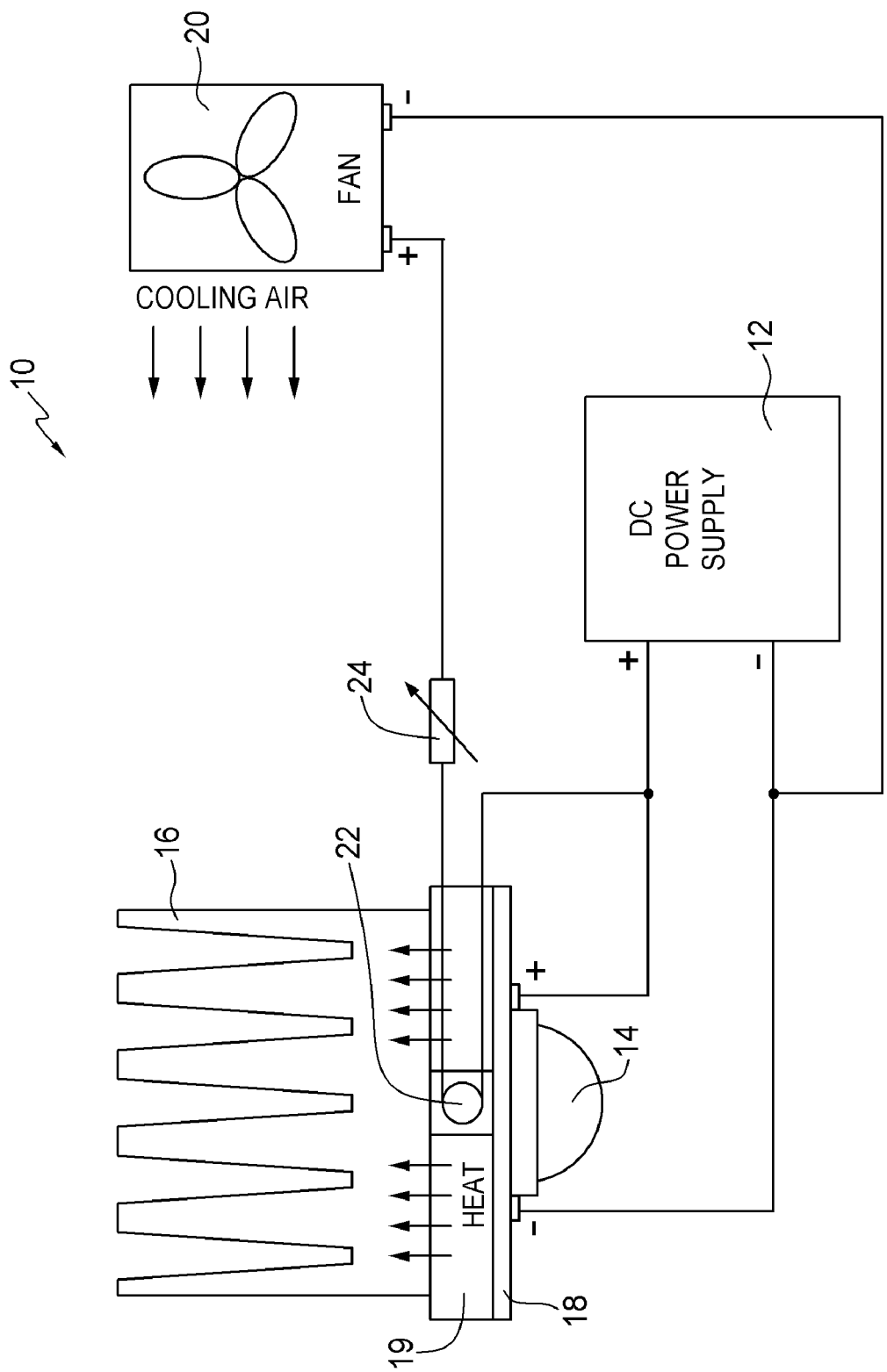
FIG. 1 is a simplified block diagram of an improved thermal control system for a light-emitting diode fixture according to an embodiment of the present invention.
Figure 3:
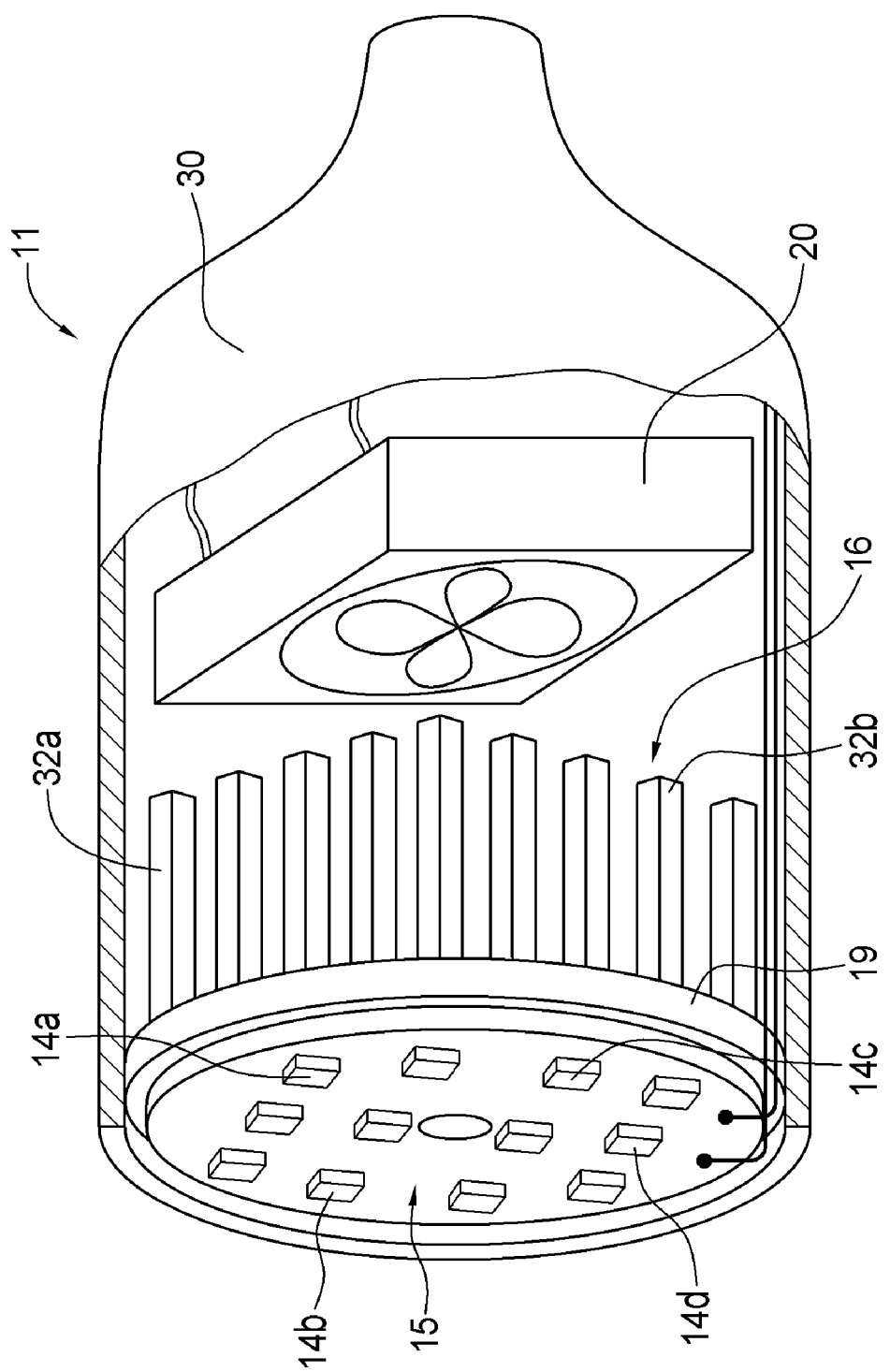
FIG. 3 is a perspective view, partly in section, of a light-emitting diode fixture provided with the thermal control system of FIG. 1.

Referring first to FIG. 1, this shows a simplified block diagram of an improved thermal control system cooling system 10 for a light-emitting diode fixture 11 which is shown in FIG. 3. Referring back to FIG. 1, a DC power supply 12 is connected to a light-emitting diode 14 mounted on a printed circuit board 18. In this example, the light-emitting diode 14 and printed circuit board 18 are thermally coupled to heat sink 16 by a thermal conductive member, in this example, a metal plate 19. However, this is not a requirement. The metal plate 19, preferably formed of copper or aluminum, is disposed between the printed circuit board 18 and the heat sink 16. The power supply 12 is also connected to a cooling device which, in this example, is cooling fan 20. A thermistor 22, thermally coupled to the heat sink 16, is connected in series between the DC power supply 12 and the cooling fan 20. Preferably the thermistor 22 is disposed within, or nested in, the metal plate 19. A resistor, in the form of a rheostat 24, is further connected in series between the thermistor 22 and the cooling fan 20. The cooling fan 20, thermistor 22, and rheostat 24 define a control circuit.

Figure 2:
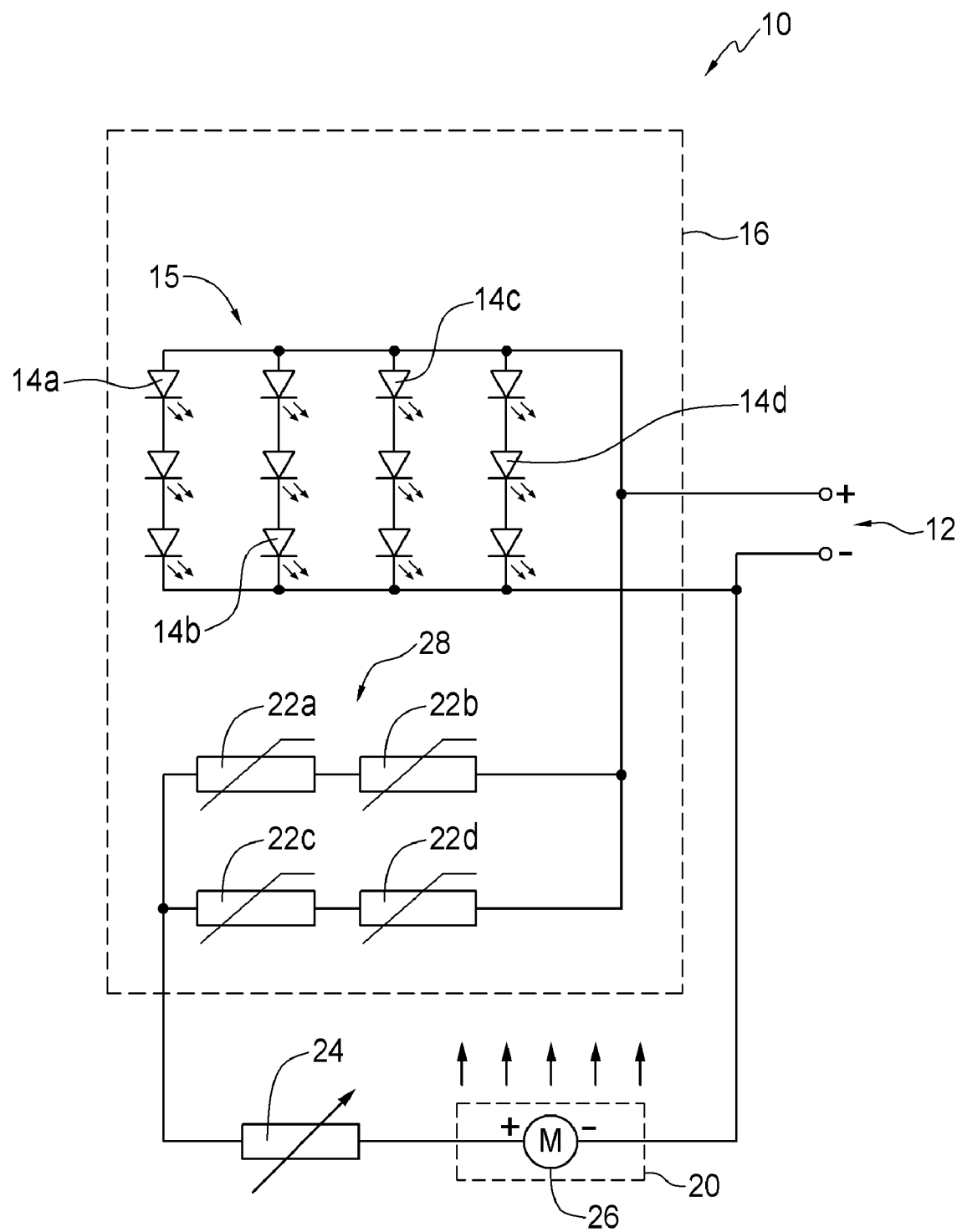
FIG. 2 is a circuit diagram of the thermal control system of FIG. 1.

Referring now to FIG. 2, this shows a circuit diagram of the thermal control system 10. A plurality of light-emitting diodes 14a, 14b, 14c, and 14d form an LED array 15. As shown in FIG. 2, the light-emitting diodes may be connected in both series and in parallel. The LED array 15 is thermally coupled to the heat sink 16 and the DC power supply 12 provides current to the individual light-emitting diodes 14a, 14b, 14c, and 14d. The LED array 15 converts electrical energy from the current provided by the DC power supply 12 into both luminous energy and thermal energy. The luminous energy is emitted as light and the thermal energy is absorbed and subsequently dissipated by the heat sink 16.

The DC power supply 12 also provides current to a DC motor 26 of the cooling fan 20. A plurality of negative temperature coefficient thermistors 22a, 22b, 22c, and 22d, connected in both series and in parallel, form a thermistor array 28 which itself is connected in series between the DC power supply 12 and the cooling fan 20. The thermistor array 28 is thermally coupled to the heat sink 16 and is sensitive to the temperature of the heat sink 16. As the temperature of the heat sink 16 increases, the resistance of the thermistor array 28 decreases. As the temperature of the heat sink 16 decreases, the resistance of the thermistor array 28 increases. Accordingly, the flow of current to the motor 26 of the cooling fan 20 is a function of the temperature of the heat sink 16.

The rheostat 24, which is connected in series between the thermistor array 28 and the cooling fan 20, controls the speed of the motor 26 of the cooling fan 20 in a manner well known in the art and accordingly is not described in detail herein. This is desirable to further conserve energy and minimize noise however it is not required. Other embodiments of the thermal control system may not include a rheostat connected in series between the thermistor array and the cooling fan. In such embodiments the cooling fan simply operates in an operational/non-operational manner dependent on the flow of current to the motor of the cooling fan which, as a result of the thermistor array, is a function of the temperature of the heat sink. Furthermore, it will be understood by a person skilled in the art that in other embodiments of the thermal control system other wiring diagrams for the light-emitting diodes and thermistors may be used to form the LED array and the thermistor array.

Referring now to FIG. 3, this shows the thermal control system 10 disposed within a housing 30 of the light-emitting diode fixture 11. Preferably, the heat sink 16 is connected to the housing 30 and a rear of the housing 30 incorporates the heat sink 16. This structure has been shown to be especially successful at dissipating thermal energy. The heat sink 16 is formed of copper or aluminum in this example and has a plurality of fins 32a and 32b which increase the surface area of the heat sink 16. Thermal energy generated by the light-emitting diodes 14a, 14b, 14c, and 14d in the LED array 15 is transferred to the heat sink 16 by conduction. The cooling fan 20 is also disposed within the housing 30 and faces the heat sink 16. The cooling fan 20 provides cooling air to the heat sink 16 to assist in transfer of thermal energy from heat sink 16 by convection. The addition of the cooling air increases the efficiency of the heat sink 16 by 20% to 30%.

To select the appropriate component values for the thermal control system 10, the following algorithm is used:

1. The approximate total power consumption ($P_S$) of the LED array is determined using the following equation:

$$P_S = P_D \times N \qquad \text{(Equation 1)}$$

where
$P_D$ is the nominal value power of the individual light-emitting diodes; and
N is the total number of light-emitting diodes in the LED array.

2. Based on the wiring diagram of the LED array the required voltage ($V_S$) is determined using the following equation:

$$V_S = V_f \times n \qquad \text{(Equation 2)}$$

where
$V_f$ is the forward voltage drop of the light-emitting diodes; and
n is the number of light-emitting diodes which are connected in series in the LED array.

and the required current ($I_S$) is determined using the following equation:

$$I_S = I_f \times m \qquad \text{(Equation 3)}$$

where
$I_f$ is the forward current of the light-emitting diodes; and
m is the number of strings or legs connected in parallel in the LED array.

3. Based on the total power consumption ($P_S$) of the LED array the approximate value of the necessary dissipative surface area ($S_{HS}$) of the heat sink to achieve a desired temperature ($T_{PCB}$) of the LED array is determined using the following equation:

$$S_{HS} = P_S / S_I \qquad \text{(Equation 4)}$$

where
$S_I$ is the value of the minimum dissipative surface area of the heat sink required to maintain the desired temperature ($T_{PCB}$) of the LED array and to compensate for thermal energy from 1 W of the total power consumption ($P_S$) of the LED array. The $S_I$ values can be obtained by statistical analysis of experimental data from trials on different heat sinks and LED arrays.

4. Based on the necessary dissipative surface area ($S_{HS}$) of the heat sink and aesthetic design considerations, the base area ($S_B$), or footprint, of the heat sink and the height ($H_{HS}$) of the heat sink are determined using known geometric principles.

5. Based on the power consumption ($P_S$) of the LED array, the required voltage ($V_S$), the required current ($I_S$), the base area ($S_B$) of the heat sink, and the height ($H_{HS}$) of the heat sink the type, quantity, and connection diagram for the cooling fan or fans used in the thermal control system is determined to satisfy the following conditions:

The total power ($P_{FT}$) applied to the fans must not be more than:

$$P_{FT} \leq (0.05 \text{ to } 0.1) \times P_S \qquad \text{(Equation 5)}$$

The voltage drop ($V_{FS}$) of the fan or series-connected fans and the voltage drop of the control circuit ($V_C$), ie. forward voltage drop of the series connection of the resistance of the thermistor array and the rheostat, must not be more than:

$$V_{FS} \pm V_C = V_S \qquad \text{(Equation 6)}$$

Taking into account that:

$$P_S = V_S \times I_S \qquad \text{(Equation 7)}$$

and considering Equation 5 and Equation 6, the value of current ($I_{FS}$) through the fan or series-connected fans and the control circuit:

$$I_{FS} = I_C = (0.05 \text{ to } 0.1) \times I_S \qquad \text{(Equation 8)}$$

Empirical analysis has shown that an acceptable proportion between $V_{FS}$ and $V_C$ can be defined as:

$$V_{FS} = 0.6 \times V_S \qquad \text{(Equation 9)}$$

accordingly $$V_C = 0.4 \times V_S \qquad \text{(Equation 10)}$$

On the basis of Equation 5, Equation 8, and Equation 9 the appropriate type of fans can be selected. The overall dimensions of the selected fans must be matched with the calculated overall dimensions of the heat sink.

6. An acceptable proportion between the voltage drop ($V_T$) of the thermistor and the voltage drop ($V_R$) in the control circuit has been determined from empirical analysis and is defined as follows:

$$V_T = (0.7 \times V_C) = (0.7 \times (0.4 \times V_S)) = (0.28 \times V_S) \approx (0.3 \times V_S) \quad \text{(Equation 11)}$$

$$V_R = (0.3 \times V_C) = (0.3 \times (0.4 \times V_S)) = (0.12 \times V_S) \approx (0.1 \times V_S) \quad \text{(Equation 12)}$$

7. The equivalent resistance of the LED array is:

$$R_S = V_S / I_S \quad \text{(Equation 13)}$$

8. Based on Equation 8, Equation 11, and Equation 13 the value ($R_T$) of the thermistor is determined using the following equation:

$$R_T = (V_T / I_C) = (0.3 \times V_S) / (0.05 \text{ to } 0.1) I_S \approx (3 \text{ to } 6) R_S \quad \text{(Equation 14)}$$

9. Based on Equation 8 and Equation 11 the value of ($P_T$) the power dissipated by the thermistor is determined using the following equation:

$$P_T = (V_T \times I_C) = (0.3 \times V_S) \times (0.05 \text{ to } 0.1) I_S \approx (0.015 \text{ to } 0.03) P_S \quad \text{(Equation 15)}$$

which is equal to just 1.5% to 3.0% of the power dissipated by the LED array.

10. Based on Equation 8, Equation 12 and Equation 13 the value $R_R$ is determined using the following equation:

$$R_R = (V_R / I_C) = (0.1 \times V_S) / (0.05 \text{ to } 0.1) I_S \approx (1 \text{ to } 2) R_S \quad \text{(Equation 16)}$$

11. Based on Equation 8 and Equation 12 the value of ($P_R$) the power dissipated by the rheostat is determined using the following equation:

$$P_R = (V_R \times I_C) = (0.1 \times V_S) \times (0.05 \text{ to } 0.1) I_S \approx (0.005 \text{ to } 0.01) P_S \quad \text{(Equation 17)}$$

which is equal to just 0.5% to 1.0% of the power dissipated by the LED array.

12. Considering Equation 8 and Equation 9 together with the fact that current through the control circuit also flows through the fan it follows:

$$R_{FS} = (V_F / I_C) = (0.6 \times V_S) / (0.05 \text{ to } 0.1) I_S \approx (6 \text{ to } 12) R_S \quad \text{(Equation 18)}$$

It will be understood by a person skilled in the art that Equation 14, Equation 15, Equation 16, and Equation 18 provide the ability to select the basic components of the thermal control system 10, i.e. the thermistors 22a, 22b, 22c, and 22d, the rheostat 24, and the cooling fan 20 using one basic value, namely, the resistance ($R_S$) of the LED array 15.

Based on the resistance ($R_T$) of the thermistor array 28 calculated using Equation 14, the current ($I_C$) flowing through the cooling fan 20 calculated using Equation 8, and the base area ($S_B$) or footprint of the heat sink 16, a person skilled in the art can readily determine the number of thermistors required in the thermistor array 28 as well as the required electrical connection between the thermistors, whether in series, in parallel, or both, to satisfy the conditions of Equation 14. On this basis nesting of the thermistors 22a, 22b, 22c, and 22d, into the base of the heat sink 16 and the general line-up of the thermal control system 10 can be determined.

Figure 4:
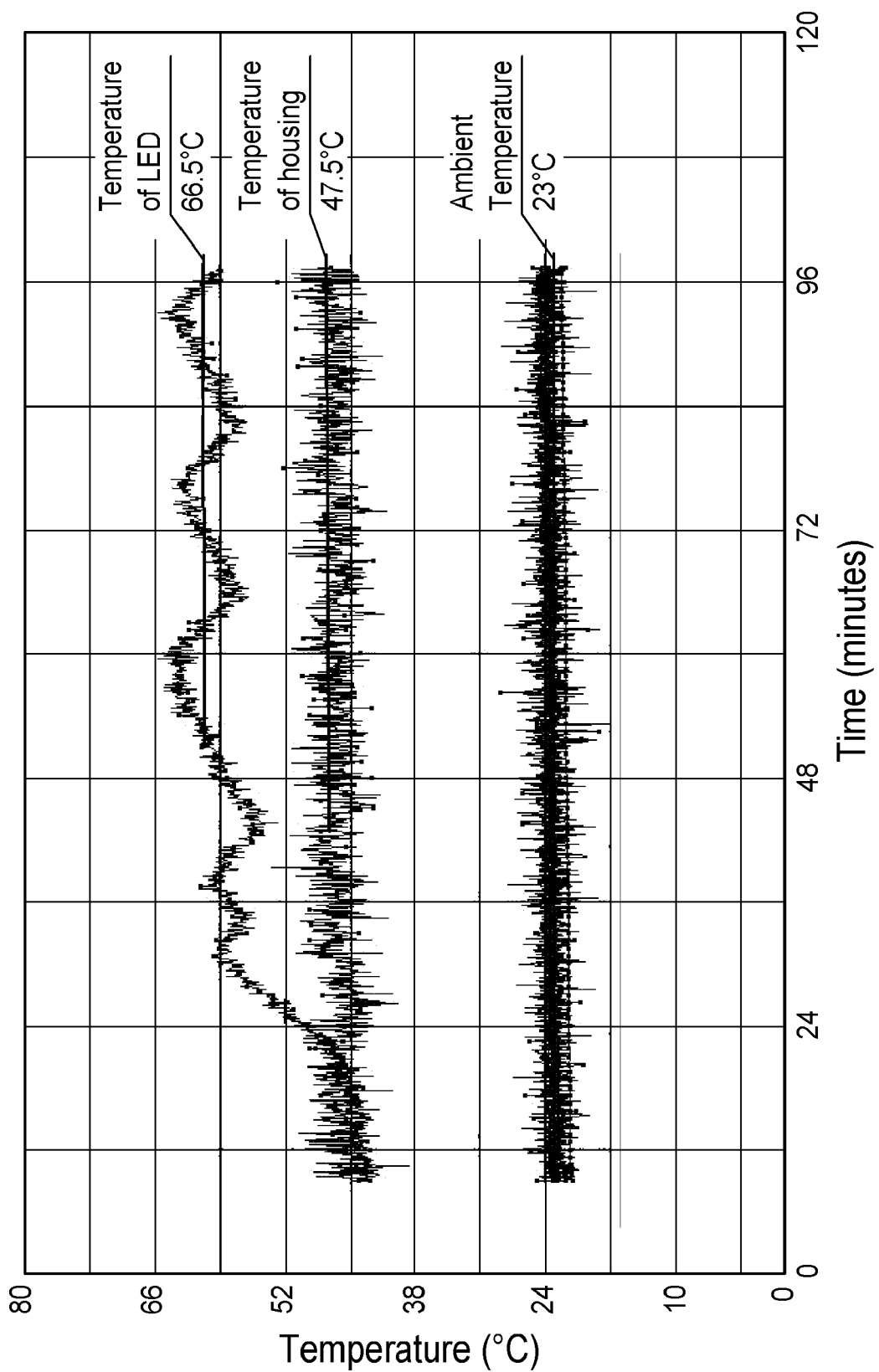
FIG. 4 is a graph showing various temperatures of a light-emitting diode fixture provided with the thermal control system of FIG. 1.

In operation, the temperature of the fixture 11 varies due to changing ambient temperatures and electrical loads. When the fixture 11 is ON, the temperature of the fixture 11 exceeds the temperature of the ambient environment, or room temperature, as best shown in FIG. 4. This is because electrical energy supplied to the light-emitting diodes 14a, 14b, 14c, and 14d by the DC power supply 12, is converted to both luminous and thermal energy. The thermal energy is, in part, absorbed and dissipated by the heat sink 16 allowing the light-emitting diodes 14a, 14b, 14c, and 14d to remain near a predetermined set temperature point to prevent thermal runaway.

As the temperature of the heat sink 16 increases and when it exceeds a threshold temperature point, the resistance of the thermistor array 28 decreases. This causes an increased current flow from the DC power source 12, through the thermistor array 28 and the rheostat 24, to the cooling fan 20. The increased current flow to the cooling fan 20 results in an increase in the output of the cooling fan 20. The cooling fan 20 blows cooling air over and/or through the heat sink 16 to increase the heat transfer coefficient, i.e. the rate at which the heat sink 16 transfers the thermal energy to the ambient environment, thereby increasing the efficiency of the heat sink 16 and preventing the fixture 11 from overheating.

As the temperature of the heat sink 16 decreases in response to the cooling air provided by the fan, the resistance of the thermistor array increases. This causes a decrease in the current flow from the DC power source 12, through the thermistor array 28 and the rheostat 24, to the cooling fan 20. The decreased current flow to the cooling fan 20 results in a decrease in the output of the cooling fan 20 thereby conserving energy and minimizing noise. When the temperature of the heat sink 16 falls below the threshold temperature the cooling fan 20 in non-operational. Accordingly, in conditions where the heat sink 16 alone is able to effectively dissipate the thermal energy generated by the light-emitting diodes 14a, 14b, 14c, and 14d the cooling fan 20 is non-operational. When the temperature of the heat sink again increases and exceeds the threshold value the cooling fan 20 is again operational.

As shown in FIG. 4, by operating in a cyclic operational/non-operational manner, as described above, the cooling fan 20 is able to maintain the heat sink 16, and by extension the LED array 15, within a desired temperature range when the fixture 11 is ON. It will be understood that when the fan is operational it may operate consistently at full speed or at variable speeds dependent on the circuitry of the thermal control system 10.

It will be understood by someone skilled in the art that many of the details provided above are by way of example only and are not intended to limit the scope of the invention which is to be determined with reference to the following claims.

What is claimed is:

1. A thermal control system for a light-emitting diode comprising:
   a heat sink;
   a negative temperature coefficient thermistor array thermally coupled to the heat sink;
   a power supply electrically connected to the thermistor array; and
   a cooling device electrically connected in series with the power supply and the thermistor array, wherein current used to power the cooling device flows from the power supply and through the thermistor array to the cooling device, and the thermistor array controls said current flow from the power supply to the cooling device based on a temperature of the heat sink which is thermally coupled to the thermistor array, thereby controlling the output of the cooling device based on the temperature of the heat sink.

2. The thermal control system as claimed in claim 1 further including a rheostat electrically connected in series between the thermistor array and the power supply.

3. The thermal control system as claimed in claim 1 further including a thermally conductive member disposed between the light-emitting diode and the heat sink wherein the thermistor array is disposed within in the thermally conductive member.

4. A light-emitting diode fixture provided with a thermal control system, the fixture comprising:
   a light-emitting diode;
   a heat sink thermally coupled to the light-emitting diode;
   a negative temperature coefficient thermistor array thermally coupled to the heat sink;
   a power supply electrically connected to the light-emitting diode and the thermistor array; and
   a cooling device electrically connected in series with the power supply and the thermistor array, wherein current used to power the cooling device flows from the power supply and through the thermistor array to the cooling device, and the thermistor array controls said current flow from the power supply to the cooling device based on a temperature of the heat sink which is thermally coupled to the thermistor array, thereby controlling the output of the cooling device based on the temperature of the heat sink.

5. The fixture as claimed in claim 4 further including a rheostat electrically connected in series between the thermistor array and the cooling device.

6. The fixture as claimed in claim 4 further including a thermally conductive member disposed between the light-emitting diode and the heat sink wherein the thermistor array is disposed within the thermally conductive member.

7. The fixture as claimed in claim 4 further including a housing and the heat sink being integral with the housing.

8. The fixture as claimed in claim 4 wherein the light-emitting diode is part of an LED array.

9. The fixture as claimed in claim 8 wherein the LED array is connected in series.

10. The fixture as claimed in claim 8 wherein the LED array is connected in parallel.

11. The fixture as claimed in claim 10 wherein the thermistor array is connected in series.

12. The fixture as claimed in claim 10 wherein the thermistor array is connected in parallel.

13. A light-emitting diode fixture provided with a thermal control system, the fixture comprising:
    a light-emitting diode;
    a heat sink thermally coupled to the light-emitting diode;
    a negative temperature coefficient thermistor array thermally coupled to the heat sink;
    a cooling device electrically connected to the thermistor array;
    a single DC power supply electrically connected to the both the light-emitting diode and the thermistor array, a positive terminal of the power supply being electrically connected to a positive terminal of the light-emitting diode and the positive terminal of the power supply being electrically connected to an input terminal of the thermistor array; and
    wherein an output terminal of the thermistor array is connected to a positive terminal of the cooling device through a rheostat, and a negative terminal of the power supply is connected both to a negative terminal of the light-emitting diode and a negative terminal of the cooling device.

* * * * *